(12) United States Patent
Sato

(10) Patent No.: US 10,009,031 B2
(45) Date of Patent: Jun. 26, 2018

(54) DATA PROCESSING DEVICE AND CONTROL METHOD THEREFOR

(71) Applicant: AXION RESEARCH INC., Tsukuba, Ibaraki (JP)

(72) Inventor: Tomoyoshi Sato, Tsukuba (JP)

(73) Assignee: AXION RESEARCH INC., Tsukuba, Ibaraki (JP)

( * ) Notice: Subject to any disclaimer, the term of this patent is extended or adjusted under 35 U.S.C. 154(b) by 0 days. days.

(21) Appl. No.: 15/591,632

(22) Filed: May 10, 2017

(65) Prior Publication Data
US 2017/0257102 A1 Sep. 7, 2017

Related U.S. Application Data

(63) Continuation of application No. 14/771,570, filed as application No. PCT/JP2014/001129 on Mar. 3, 2014, now Pat. No. 9,667,256.

(30) Foreign Application Priority Data

Mar. 1, 2013 (JP) ................................. 2013-040536

(51) Int. Cl.
*H03K 19/177* (2006.01)
*H03K 19/173* (2006.01)
*G11C 7/22* (2006.01)

(52) U.S. Cl.
CPC ........... *H03K 19/1776* (2013.01); *G11C 7/22* (2013.01); *H03K 19/173* (2013.01);
(Continued)

(58) Field of Classification Search
CPC .................. G11C 7/22; H03K 19/1776; H03K 19/17728; H03K 19/173
See application file for complete search history.

(56) References Cited

U.S. PATENT DOCUMENTS

| 6,020,760 A | 2/2000 | Sample et al. |
| 6,868,017 B2 * | 3/2005 | Ikeda .................... G06F 15/781 365/189.05 |

(Continued)

FOREIGN PATENT DOCUMENTS

| JP | 2009-213054 A | 9/2009 |
| TW | I441078 B | 6/2014 |

(Continued)

OTHER PUBLICATIONS

International Search Report (PCT/ISA/210) dated Jun. 3, 2014, by the Japanese Patent Office as the International Searching Authority for International Application No. PCT/JP2014/001129.
(Continued)

*Primary Examiner* — Tri Hoang
(74) *Attorney, Agent, or Firm* — Buchanan Ingersoll & Rooney PC

(57) ABSTRACT

A data processing device includes a data processing unit including a plurality of elements and wiring groups that connect the plurality of elements, wherein respective elements in the plurality of elements include: a logic element; an acquisition unit that switches on and off an input side of the logic element for any wire out of the wiring groups on a cycle-by-cycle basis to latch input data; and a post unit that switches on and off an output side of the logic element for any wire out of the wiring groups on a cycle-by-cycle basis, and the data processing unit also includes a timing control unit that controls logic executed by the logic element and functions of the acquisition unit and the post unit on a cycle-by-cycle basis.

5 Claims, 9 Drawing Sheets

(52) U.S. Cl.
CPC . *H03K 19/17728* (2013.01); *H03K 19/17736* (2013.01); *H03K 19/17744* (2013.01)

(56) References Cited

U.S. PATENT DOCUMENTS

| | | | |
|---|---|---|---|
| 7,268,581 | B1 | 9/2007 | Trimberger et al. |
| 7,380,100 | B2 * | 5/2008 | Shimura ............. G06F 15/7867 712/15 |
| 7,500,023 | B2 * | 3/2009 | Casper .................. G06F 13/126 710/35 |
| 7,882,278 | B2 * | 2/2011 | Chadha ............... G06F 13/4059 370/229 |
| 2007/0210826 | A1 | 9/2007 | Madurawe |
| 2009/0224799 | A1 | 9/2009 | Ogawa |
| 2011/0004744 | A1 | 1/2011 | Honda |

FOREIGN PATENT DOCUMENTS

| | | |
|---|---|---|
| WO | WO 2005/022380 A1 | 3/2005 |
| WO | WO 2006/046711 A1 | 5/2006 |

OTHER PUBLICATIONS

Written Opinion (PCT/ISA/237) dated Jun. 3, 2014, by the Japanese Patent Office as the International Searching Authority for International Application No. PCT/J P2014/001129.

Notification of Transmittal of Translation of the International Preliminary Report on Patentability (Forms PCT/IB/338 and PCT/IB/373) and the Written Opinion of International Searching Authority (Form PCT/ISA/237) dated Sep. 11, 2015 by the International Bureau of WIPO, in corresponding International Application No. PCT/JP2014/001129. (8 pages).

The extended European Search Report dated Sep. 20, 2016, by the European Patent Office in corresponding European Patent Application No. 14756929.7-1810. (9 pages).

Taiwanese Office Action dated Jan. 2018, corresponding to the Taiwan Patent Application No. 103124833 (7 Pages).

* cited by examiner

DATA PROCESSING DEVICE AND CONTROL METHOD THEREFOR

CROSS-REFERENCE TO RELATED APPLICATIONS

The present application is a continuation of U.S. application Ser. No. 14/771,570, filed on Aug. 31, 2015 (now U.S. Pat. No. 9,667,256), which is a US National Stage Application of PCT/JP2014/001129, which was filed on Mar. 3, 2014. PCT/JP2014/001129 claims the priority of Japanese Patent Application No. 2013-040536, which was filed on Mar. 1, 2013. The present application incorporates by reference the subject matter of U.S. Ser. No. 14/771,570; PCT/EP2014/001129; and Japanese Patent Application No. 2013-040536.

TECHNICAL FIELD

The present disclosure relates to a data processing device capable changing process and a method of controlling the same.

BACKGROUND ART

PCT Publication WO2005/022380 discloses a data processing device that uses architecture code including: object circuit information for dynamically mapping an object circuit, which forms at least part of a circuit for executing an application, onto part of a reconfigurable logic circuit; interface circuit information for mapping an interface circuit, which connects to the object circuit, onto the logic circuit; and environmental conditions to be realized in the interface circuit.

SUMMARY

By dynamically reconfiguring a circuit on a cycle-by-cycle basis (on a cycle basis, in cycles, in cycle units), the utilization efficiency of hardware is increased and it is possible to flexibly implement an algorithm using hardware, so that it is also easy to improve the processing speed. However, there is still the need to connect electronic components with wiring to configure electrical circuits that carry out the intended operations, so that a large number of wiring resources are needed to execute a variety of algorithms while dynamically reconfiguring circuits.

One aspect of the present disclosure is a control method of a device that includes a data processing unit including a plurality of elements and channels that transfer data between the plurality of elements. Respective elements in the plurality of elements of the data processing unit include: a logic element; an acquisition unit that switches a connection between an input side of the logic element and the channels on and off on a cycle-by-cycle basis to control necessity of acquisition of data; and a post unit (posting unit) that switches a connection between an output side of the logic element and the channels on and off on a cycle-by-cycle basis, and the data processing unit further includes a control unit that controls switching on and off of the acquisition unit and switching on and off of the post unit.

The control method includes the following step.
1. Changing, on a cycle-by-cycle basis, acquisition and posting of the plurality of elements for the channels in controlling of the controller switching on and off of the acquisition unit or the switching on and off of the post unit on a cycle-by-cycle basis.

The changing on a cycle-by-cycle basis may include changing a configuration of the channels on a cycle-by-cycle basis. Also, the changing on a cycle-by-cycle basis may include changing a processing detail of the logic element.

Also, the changing on a cycle-by-cycle basis may include the following steps.
  Controlling, by autonomously of the control unit, the processing details of the logic element, the switching on and off of the acquisition unit, or the switching on and off of the post unit on a cycle-by-cycle basis.
  Controlling, by loading from an outside, a processing detail of the logic element, the switching on and off of the acquisition unit, and the switching on and off of the post unit on a cycle-by-cycle basis.

Another aspect of the present disclosure is a device that comprises a data processing unit including a plurality of elements and channels that transfer data between the plurality of elements. The respective elements in the plurality of elements include: a logic element; an acquisition unit that switches a connection between an input side of the logic element and the channels on and off on a cycle-by-cycle basis to control necessity of acquisition of data; and a post unit that switches a connection between an output side of the logic element and the channels on and off on a cycle-by-cycle basis. The data processing unit further includes a timing control unit that controls switching on and off of the acquisition unit and switching on and off of the post unit on a cycle-by-cycle basis. The respective elements in the plurality of elements may include the timing control unit. The timing control unit may include a unit that changes a processing detail of the logic element on a cycle-by-cycle basis.

It is desirable for the device to further include a memory that stores information for implementing an application, an algorithm, or logic on the data processing unit. The information for implementing includes: information for selecting any of the plurality of elements; and timing information for controlling at least one of the switching on and off of the acquisition unit and the switching on and off of the post unit on a cycle-by-cycle basis. The timing information may include information for selecting a processing detail of the logic element on a cycle-by-cycle basis. The device may further include a unit that supplies, from the memory, at least part of the information for implementing via the channels to respective elements in the plurality of elements.

The channels may include wiring groups, the acquisition unit may include a unit that switches a connection with any wire in the wiring groups on and off on a cycle-by-cycle basis, and the post unit may include a unit that switches a connection with any wire in the wiring groups on and off on a cycle-by-cycle basis. The channels may include: first wiring channels disposed along a first direction; and second wiring channels disposed along a second direction that differs to the first direction, and the data processing unit may include a wiring box that connects to the first wiring channels and the second wiring channels in a time division. The wiring box may include an input-side box and an output-side box.

The elements may include a block in which a function that carries out specified processing that is fixed. The timing control unit may include: a function of autonomously controlling the switching on and off of the acquisition unit and the switching on and off of the post unit on a cycle-by-cycle basis; and controlling the switching on and off of the acquisition unit and the switching on and off of the post unit on a cycle-by-cycle basis according to loading from the outside. Such functions (functional units) may include a function that controls a processing detail of the logic element on a cycle-by-cycle basis.

It is desirable for the post unit to include a unit that outputs an extended bit including additional information. It is desirable for the post unit to include a multi-channel compatible output switch that realizes a synchronization function.

DETAIL DESCRIPTION

Figure 1:
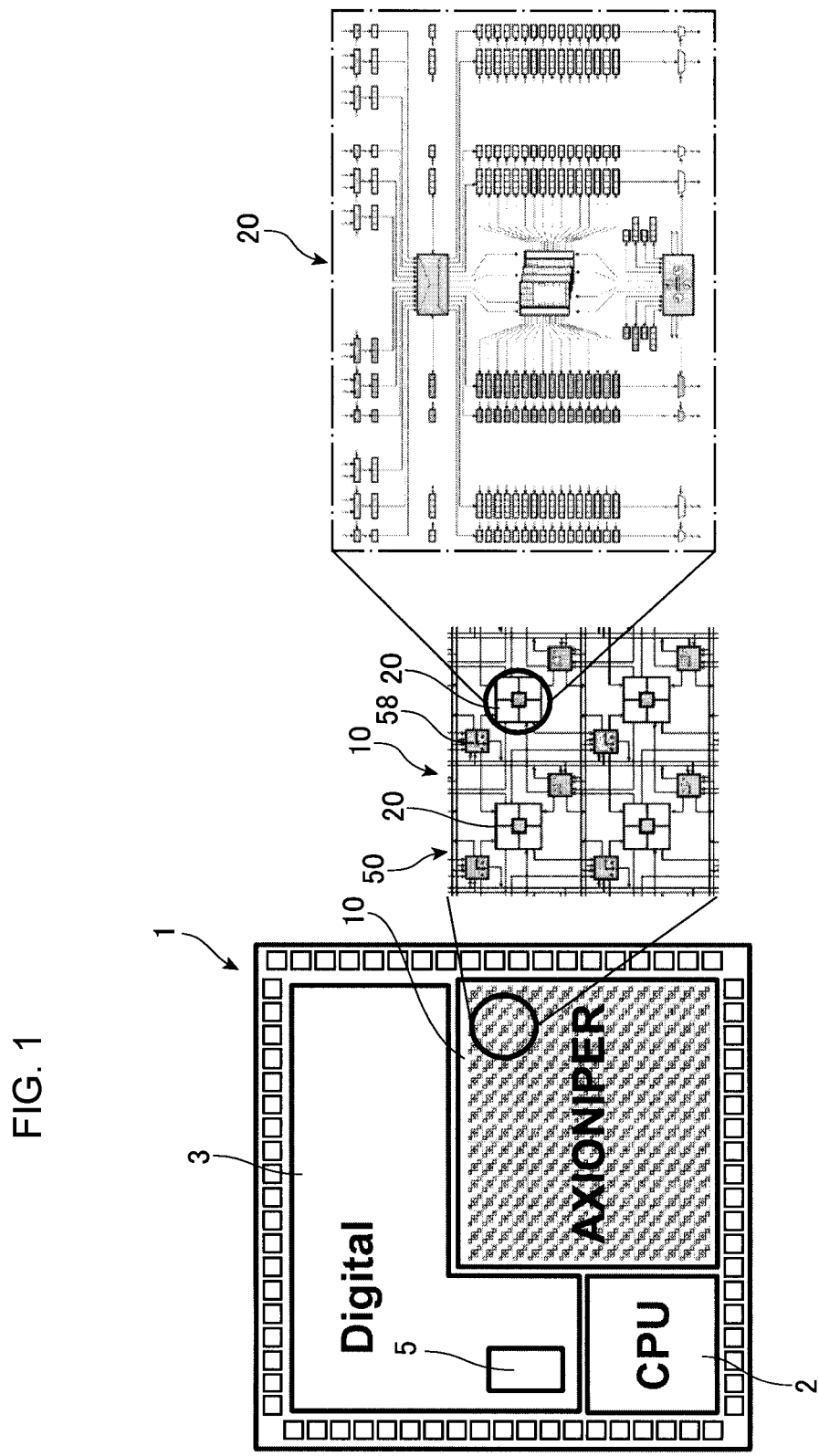
FIG. 1 is a diagram showing an overview of a data processing device.

One example of a programmable data processing device is a device including a logic circuit in which circuits can be dynamically reconfigured. A "circuit" is defined here as a "path on which electricity flows and which is closed like a ring" and an "electronic circuit" is defined as "an electrical circuit where electronic components are connected by electrical conductors to produce a current path for having a desired operation carried out" or the like. On the other hand, if we suppose the intended operations (processes, arithmetic operations, logic operations) to be implemented with an electronic circuit carry out intermittently, for example, intermittently at the timing of clock cycles, it is not actually necessary to form a closed path. Accordingly, it is not necessary to form an electronic circuit to have a desired operation carried out. By using a data processing unit that is capable of advancing proceeding without forming circuits, or in other words, a "non-circuit" type data processing unit, it is possible to obtain the same results as the results obtained by a logic circuit.

In the present specification, a device (data processing apparatus, data processing system) with a data processing unit including a plurality of elements (or "nodes", "processing elements", "processing units") and channels that transfer data between the plurality of elements is described. Representative examples of such channels are electronic and/or optical paths referred to as "wiring channels", "wiring groups" or a "wiring matrix". Such channels may be laid out in two dimensions or may be laid out in three dimensions. The channels may be laid out in advance in accordance with appropriate rules in the manner of wiring channels or may be formed as appropriate in space by a directional communication means, as with visible light communication.

A communication means that uses light or electromagnetic waves but does not have a high degree of directionality is capable of forming channels for transferring or exchanging data between predetermined elements by adopting an appropriate protocol. However, when the time required for processing such protocol is taken into consideration, it is desirable that the connection can be switched on and off using hardware.

The respective elements in the plurality of elements include a logic element (core), an acquisition unit (acquisition device, input unit, get unit, read unit, acquire unit) that controls whether it is necessary to acquire data (a concept of data includes signals) by switching a connection between the input side of the logic element and a channel or channels on and off on a cycle-by-cycle basis, and a post unit (posting unit, post device, submitting unit, device for placing data or a signal on a channel) that switches a connection between the output side of the logic element and a channel or channels on and off on a cycle-by-cycle basis. The data processing unit further includes a timing control unit that controls, on a cycle-by-cycle basis, the processing details (content) of the logic element, the switching on and off of the acquisition unit, and the switching on and off of the post unit.

The acquisition unit does not passively wait for input data to flow into it but instead acquires data or a signal that has been placed on a channel by switching a connection to such channel on and off and feeds the data or signal into the element. As one example, the acquisition unit may switches a connection to a channel on and off to turn the flow of data into the element on and off or may switches a connection to a channel on and off by latching or not latching data that has been posted onto such channel to control the necessity of the acquisition of the data. The post unit does not simply let data flow onto a channel and instead switches the connection to a channel on and off to get (gain) and give up (release) authorization to drive the channel.

Such data processing unit may realize an application or algorithm by forming a connected relationship between a plurality of elements using the channels (for example, wiring groups) to configure circuits in which a plurality of elements are connected, that is, by generating or fixing circuits to carry out an intended operation (desired behavior), even if only in cycles.

On the other hand, without fixing or generating a circuit for carrying out the intended or desired operation, it is possible to control the timing of processing of the logic elements (cores), the acquisition units and the post units to change the acquisition and posting (the relationship between acquisition and submission, the relationship between get and post) of respective elements for (from and to) the channels on a cycle-by-cycle basis (on a clock cycle basis, on a clock-by-clock basis, in units of clock cycles).

In the data processing unit, the connection relationships (connections) between elements are not defined by channels alone. Although the channels distribute data that has been posted, acquisition is performed by elements, with such acquisition not being defined or limited by the channels themselves. The channels may be multi-routed, and access of the elements may be limited to the respective routes, and the elements capable of accessing data that has been posted may be limited to such range. The respective elements autonomously obtain data from channels and post data onto channels. A channel does not define the connection relationship between elements and get/post (get/put, input/output) by elements onto channels change one cycle at a time. This means that it is not necessary that the intended operation or behavior could be or should be understandable from the on/off switching of connections to be implemented on a cycle-by-cycle basis in the data processing unit.

By changing the get/post relationship of elements with the channels on a cycle-by-cycle basis (on a cycle basis), it is possible to produce information ("timing information" or "function information") that defines the get/post of elements for the channels for getting, after a predetermined number of clock cycles has elapsed, the same result as a circuit that carries out the intended operation is obtained. Although such function information includes the timing of acquisitions from channels to which elements belong or which can be accessed by elements, a selection of channels, the timing of posts, and a selection of channels for posting, such information does not indicate the configuration (or reconfiguration) of a circuit or connection relationship directly. The exchanging (input/output, post/get) of data on a cycle-by-cycle basis can be decided according to whether the acquisition unit and post unit of each element accesses (switches on/off, turns on/off) the respective channels.

When the gets (acquires) and posts of a plurality of elements from and onto the channels are changing repeatedly and then a desired operation (process, computation) is carried out, the channels may function as a broadcast network that provides data in a single cycle to other elements capable of accessing such channels without specifying the recipients. It is preferable for the channels to be multi-routed like wiring groups because this makes it possible to use or transmit a wider variety of data in parallel. A wiring group functions as a broadcast network that provides data in units of one clock cycle from an element that has accessed one of the wires to other elements that are capable of accessing such wire without specifying the recipients.

By controlling posting onto and acquiring from a channel independently on element-by-element basis (in element units), it is possible to prevent channels from becoming occupied by specified elements and to greatly increase the utilization efficiency of channel resources (wiring resources). Also, channels on which no signals (data) are placed in any cycle, that is, channels that are not driven by any of the elements may be or could be eliminated, which also makes it possible to greatly increase the utilization efficiency of channel resources. That is, although the technology that can be implemented in the data processing unit may define connections between elements, it is not necessary to define the connections between elements, and by not defining the connections between elements, the channels do not become occupied and the range of usage widens, resulting in a significant improvement in the utilization efficiency of hardware.

The users (or "user elements", "transmitter" and "receiver") of a channel change on a cycle-by-cycle basis, and a circuit for performing the desired behavior or operation is not formed via the channels. On the other hand, access to a channel (on/off switching of a connection) is controlled by the acquisition units and the post units switching their connections on and off, that is, by connecting or not connecting. This means that channels, for example, wiring resources, are used or defined as broadcast media that is changeable in cycles, between the elements that are connected to such channels on cycle-by-cycle basis and do not require a communication protocol to be established in cycles. That is, channels (wiring resources) are not asynchronous items and instead channels function as media (items, elements) that transmit information in a range that is synchronized with the transmitter and/or the receiver.

For this reason, information relating to different logic or an algorithm can be posted (outputted) to a channel by an element on a cycle-by-cycle basis and acquired by another element (which is not limited to one element) on a cycle-by-cycle basis. Accordingly, it is possible to reduce the channel resources, such as wiring, and to provide a data processing device (apparatus, system) that has a high packing density and a high utilization efficiency of hardware. In addition, channels may be used as logic operation elements that operate a logic on a cycle-by-cycle basis. That is, by carrying out schedule management of whether to connect to a channel by the acquisition units and/or post units, channels may be a configure part of wired logic. In addition, a channel may be capable of reflecting quantum operations and may construct part of a quantum computer.

In a device including such data processing unit, information (high-level information, function information) that includes an application, an algorithm, and/or logic and execution and/or implementation of procedures may be written in a high-level language, is converted to information on a selection (specification) of elements and timing of acquisitions and posts from and onto channels. Such function information may converts including selections of channels for acquisitions and posts. The information that specifies an element may be a position, for example, and may be converted into two-dimensional or three-dimensional position information. The timing of processing (the passage of time) may be taken into consideration, the function information (high-level information) may be converted to four-dimensional information if the layout of elements is in three dimensions and may be converted to three-dimensional information if the layout of elements is on a plane. The selection (specifying) of elements may also be in one dimension, and the high-level information may be converted to two-dimensional information. It is also possible to convert the high-level information to multi-dimensional information with five or more dimensions.

If there is redundancy for the elements, the information that selects elements does not need to be information that indicates specific elements, specific locations, or the like, and may be converted to information with a high degree of substitutability. Similarly, if there is redundancy for the channels or a degree of freedom regarding timing (as examples, it is possible to reserve occupied time for wiring and/or it is permissible to delay data and/or to save data), the information showing timing may be converted to information with a high degree of substitutability. Accordingly, the function information (high-level information) for having the data processing unit carry out the desire behavior or processing can be provided as information with an extremely high degree of substitutability, which makes it possible to use the hardware of the data processing device according to a variety of purposes, including high-speed processing, low power consumption, and massive parallelism.

The wiring groups may be fixed or may be reconfigurable. The processing details to be realized by the elements (logic operations, arithmetic operations) may also be fixed or may be reconfigurable or changeable. To improve the redundancy of elements, it is desirable for the logic to be realized by elements to be changeable.

The timing control unit may carry out control of the processing details of logic elements, on/off control of the acquisition units, or on/off control of the post units autonomously on a cycle-by-cycle basis on an order and/or information that has/have been set in advance. The timing control unit may also carry out control of the processing details of logic elements, on/off control of the acquisition units, and on/off control of the post units on a cycle-by-cycle basis by loading from the outside. Although the timing control unit may control elements on a cycle-by-cycle basis by only loading from the outside, the data processing unit also includes channel resources for loading information for such purpose, that is, the function information described earlier, from the outside. On the other hand, if loading from the outside is not carried out, there is the possibility of limitations on the content (operation, logic, behavior) that can be controlled by the timing control unit. Accordingly, it is desirable to combine the two types of control described above.

The data processing device has a memory that stores information (function information) for implementing an application, an algorithm, or logic in the data processing unit, and may include a unit that supplies at least part of the information to be implemented from the memory via the channels to the individual elements in the plurality of elements. Since the channels are not occupied exclusively by processing between elements, it is possible to put the channels to the further use of supplying function information to the elements in parallel or in a time division.

The channels (wiring resources) may be fixed or may be reconfigurable, and may be formed as necessary as with, for example, visible light communication. It is desirable for the channels to be multi-routed like wiring channels and it is effective for making the wiring resources to be accessed by a plurality of elements to be localized and/or grouped within an appropriate range. Also, channels may be multiplexed or multilayered, and may be channels that allow data to be transferred in two dimensions, in three dimensions and also in the time dimension via a memory, delay elements, or the like.

One example of channels is channels that include first wiring channels disposed or placed along a first direction and second wiring channels disposed or placed along a second direction. It is desirable for the first wiring channels and the second wiring channels are different direction such as vertically and horizontally to cover a region or space in which a plurality of elements have been laid out in a grid or a matrix. The first wiring channels and second wiring channels may intersect or may not intersect, and a larger number of wiring channels, such as a third wiring channel, with different transmission directions for data may be included. As described above, the wiring channels do not need to be two-dimensional and may be laid out in three dimensions or in multiple dimensions (four or more dimensions) including time.

The data processing unit includes a wiring box that connects to the first wiring channels and the second wiring channels in or according to time division. By dynamically connecting the wiring channels together, it is possible to reconfigure the wiring channels and to reconfigure the elements for which access to data is localized by the wiring channels. It is desirable for the acquisition units and the post units to be capable of accessing the first and second wiring channels independently. The acquisition units and the post units may be capable of accessing the first and second wiring channels directly or may be capable of accessing via a time-sharing-type wiring box.

One example of an element is an element where, as making data flows to the logic element that is the core, an input-side box that is the acquisition unit and an output-side box that is the post unit are connected so as to sandwich the core. The logic element includes a fixed function block and a block where function rewrites are possible, with it being possible to independently connect a plurality of (for example, four) wiring channels to such blocks. It is desirable for a logic element to include at least one block where function rewrites are possible and for the processing details of such block to be updated as necessary without loading from the outside. The wiring cost required to change (rewrite) the function of the logic element (core) can be further reduced. That is, for functions (operations and the like) with a high usage frequency, dedicated fixed function selection information is copied into a memory switch on the output side from function selection information that is internally provided and has been compressed. By doing so, it becomes unnecessary to fetch the function selection information used for updating every time from the outside.

It is desirable for the logic element (core) to further include a function for posting an extended bit (extension bit) including an additional information such as an operation function or others, from the output side, that is, the post unit. By doing so, it becomes possible to post data with a structure that is compatible with an output of an overflow, a zero flag, parity, a carry bit, a multi-bit operation-compatible carry, shift information, an exception event output, or the like onto a channel.

It is desirable for a logic element to further include a function that controls a multi-channel compatible output switch of the post unit for realizing a synchronization function. As one example, when an event has suddenly occurred, to generate a processing region to respond to the event, it is necessary to change the assignments of wiring resources and element resources to instantaneously generate a non-reserved or free processing region in the hardware. Controlling the response for changing the assignment of such resources and controls the timing of the input channels and output channels is required to execute processing in response to events without conflicts in such processing region, and the control elements for such purpose may be implemented inside elements or may be provided outside.

However, the connections to wiring are only changeable corresponding to the two different request; one is compatible with patterns that are configured in advance, the other is corresponding to information that are updated when event information is received, and a function for confirming the integrity and/or consistency is not implemented. Such function may be temporary configured on an adjacent core if addition of such function is necessary and such configuration is then destroyed (updated) when the function is complete.

The wiring channels can use a construction that operates using an implicit assignment of time slots. One example of the acquisition unit (acquisition device) uses a shift register-type flip-flop and an AND gate with a simple mask function and decides whether valid data is to be fetched or not. For an example where control is carried out with four bits as a unit, four cycles of information (function information) on whether fetching is necessary is stored in a flip flop. From the fifth cycle onward, it is decided whether function information is to be fetched from a memory or whether the processing is to return to the start and repeat the same four cycles. If the pattern is long, by loading the fifth cycle, the ninth cycle, and the thirteenth cycle respectively from a memory and repeating, it is possible to provide a margin for the access time of the memory and at the same time to produce a structure that is compatible with long patterns.

A wiring channel switch to be implemented in a wiring box has a function that fundamentally decides whether to switch to a channel that designates the next vertical channel out of a plurality of vertical channels, or to switch to a channel that designates the next horizontal channel. In a normal arrangement, an application fundamentally has responsibility over whether a switch has operated normally. That is, since the configuration of wiring channels does not decide the connections between elements, transmission and reception between elements are decided by controlling whether an element side is to carry out access together with the timing. Accordingly, it is meaningless to physically verify the connections of the wiring, but an error check may be added using the information of selection of elements and timing.

When priority is given to reducing cost, elements are operated with a premise of the wiring channels being switched normally. The acquiring of data is controlled on the element side and a wiring channel switch only has a function for switching (inputting and outputting) between the wires. Getting (inputting) is carried out by merely switching correspond to the data at timing that has been designated. It is also possible to use a function that merely selects the wiring channel to output and sets the data as valid.

FIG. 1 shows, partially in enlargement, one example of a data processing device 1 that includes a data processing unit 10 that is capable of carrying out processing without forming a circuit. The data processing device 1 includes a digital processing unit 3 that carries out digital processing using a fixed circuit or a reconfigurable circuit, a CPU 2, a memory 5, and the data processing unit 10 that carries out processing according to timing control. The non-circuit type data processing unit 10 includes a plurality of elements (cells) 20, wiring channels 50 that are disposed vertically and horizontally in a matrix, and wiring boxes 58.

Figure 2:
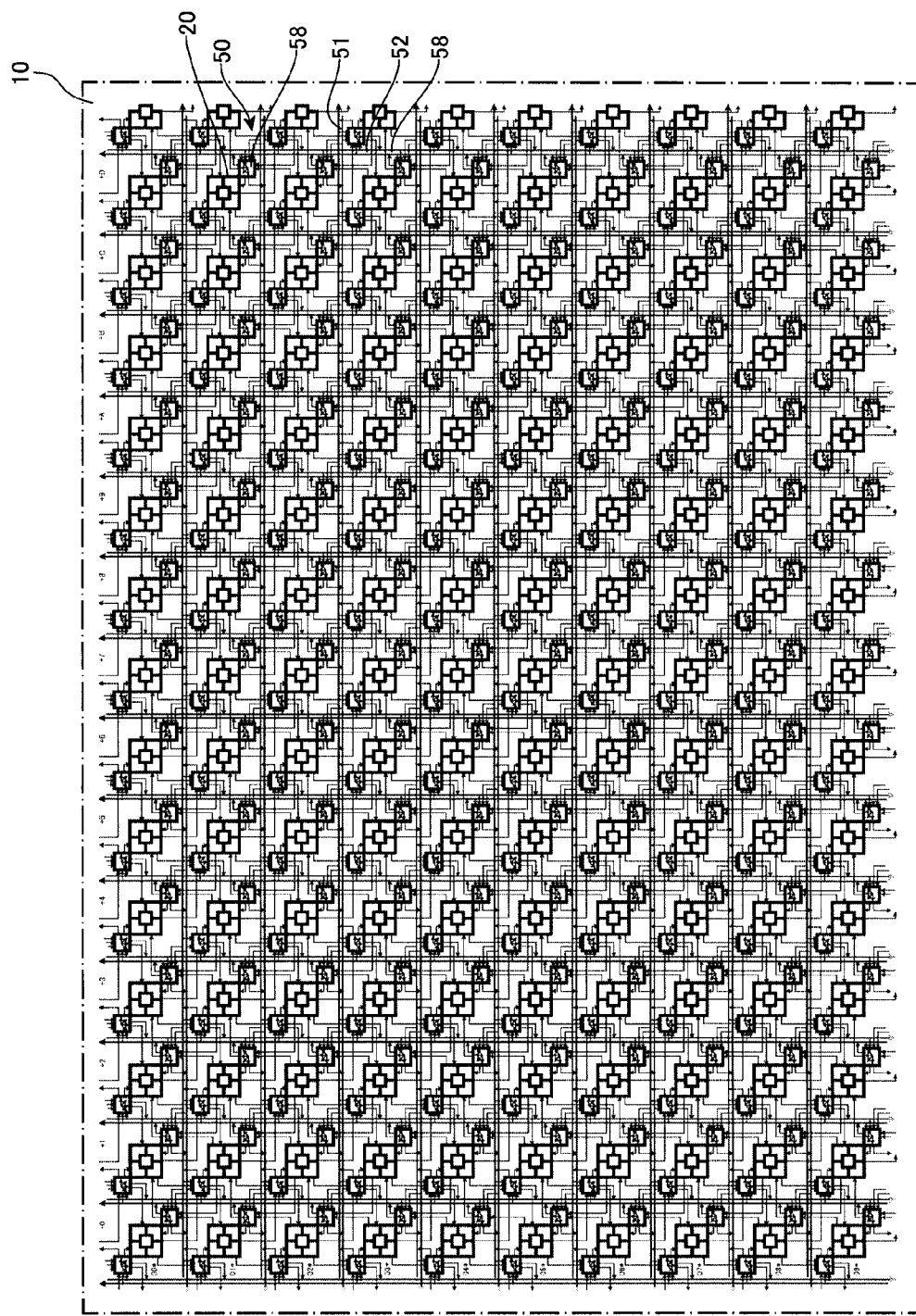
FIG. 2 is a diagram showing an overview of a data processing unit.

FIG. 2 shows part of the configuration of the non-circuit type data processing unit 10 in enlargement. The data processing unit 10 includes a plurality of elements (cells) 20 (in the present embodiment, 64 by 64, making a total of 4,096 elements), and wiring channels 50 disposed vertically and horizontally so as to be capable of connecting such elements 20. The wiring channels 50 includes horizontal wiring (first wiring channels) 51 disposed in the horizontal direction (the first direction) in FIG. 2 and vertical wiring (second wiring channels) 52 disposed in the second direction that is perpendicular to the horizontal wiring 51.

Figure 3:
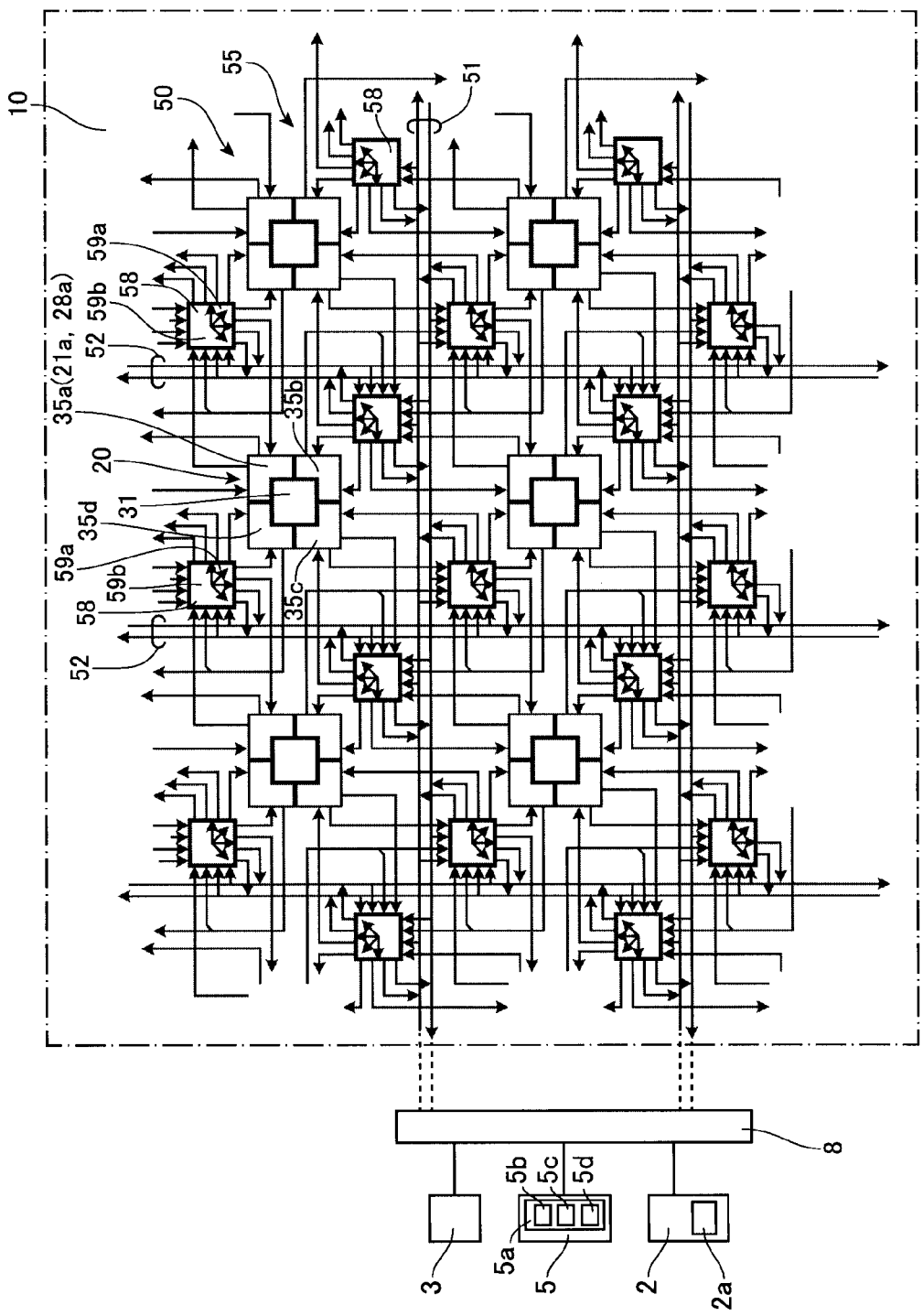
FIG. 3 is a diagram showing an enlargement of the configuration of the data processing unit.

FIG. 3 shows part of the configuration of the non-circuit type data processing unit 10 in further enlargement. An element 20 includes a central core 31 and connection control units 35a, 35b, 35c, and 35d in the four directions that are disposed around the core 31. The connection control units 35a to 35d respectively include, as described later, the acquisition units 21a to 21d and the post units 28a to 28d. The wiring channels 50 include, in addition to the vertical and horizontal wiring channels 51 and 52, local wiring channels 55 that connect the wiring boxes 58 and the elements 20. The respective elements 20 are capable of connecting via the wiring boxes 58 to the vertical and horizontal global wiring channels 51 and 52.

The respective elements 20 are also capable of connecting to the adjacent elements 20 by the local wiring channels 55 via the wiring boxes 58 without using the global wiring channels 51 and 52. The range to which an element 20 can connect locally is not limited to the four directions and may be limited to eight directions or may be extended further to the outside. The elements 20 may also be capable of connecting locally without passing via the wiring boxes 58. Since local wiring has a high probability of being occupied by the elements 20, the utilization efficiency of wiring may not be high. On the other hand, since the global wiring channels 51 and 52 can be free or released from exchanging data between local elements 20, the utilization efficiency of the channels 51 and 52 is improved.

The wiring boxes 58 reconfigure the connections of the wiring included in the vertical and horizontal wiring channels 51 and 52 on a cycle-by-cycle basis in a time division (time sharing). A wiring box 58 includes an input box 59a and an output box 59b and is capable of controlling the output and output direction from the element 20 to the wiring channels 51 and 52. In the present embodiment, the elements (cells) 20 have a construction where it is possible to independently switch on and off connections to four (four directions of) wiring channels 50 that are the two wiring channels 51 disposed above and below the element 20 and the vertical wiring channels 52 disposed to the left and right. The number of wiring channels where a connection can be turned on and off is not limited to four directions. If the elements 20 are disposed in three dimensions, turn on and off of eight directions (eight wiring channels) may be used. Since the angle at which the wiring channels intersect is not limited to 90°, it is also possible to dispose wiring channels that extend in a larger number of directions, and elements 20 capable of controlling connections to such wiring channels may be disposed.

The wiring boxes (connection control boxes, wiring channel switches) 58 include a function that decides, on a cycle-by-cycle basis, whether to switch to a channel that the next designated vertical side channel 52 out of the plurality of vertical side channels 52 or to switch to a designated channel of the horizontal channels 51. Applications fundamentally have responsibility for whether the switching of the wiring box 58 is normal or not, and if this is a concern, an error checking function is added to the connection control unit of the wiring boxes 59. If priority is given to reducing cost, operations may be carried out under the premise that switching is being carried out normally. The elements 20 select whether it is necessary to fetch or acquire data. Accordingly, a wiring box 58 only has a function for switching (getting and outputting) between wiring and only carries out switching for acquiring the data at timing designated by the element 20 that shall acquire the data. A wiring box 58 may only carries out a process that selects the wiring channel on which the element 20 is to output and sets the data as valid.

The data processing unit 10 is connected via a bus 8 to the digital processing unit 3, the CPU 2, and the memory 5. Function information 5a for implementing an application or the like in the data processing unit 10 is stored in the memory 5. The function information 5a includes the timing information 5b described earlier and information 5c that selects (specifies) elements. The function information 5a may also include information 5d that controls the wiring boxes 58 on a cycle-by-cycle basis, and the like.

The CPU 2 includes a function (supply unit) 2a that supplies the function information 5a from the memory 5 to each element 20 via the wiring channels 50. The supply unit 2a supplies the function information 5a to the respective elements 20 via the wiring channels 50 at timing such as resetting of the device 1 or the start of specific processing. In addition, the supply unit 2a posts the function information 5a to the wiring channels 50 during processing so that predetermined elements 20 can load the function information 5a. In the data processing unit 10, since the wiring channels 50 are released on a cycle basis, shared use of the wiring channels 50 can be made for exchanging data between the elements 20, supplying the function information 5a, or the like.

Figure 4:
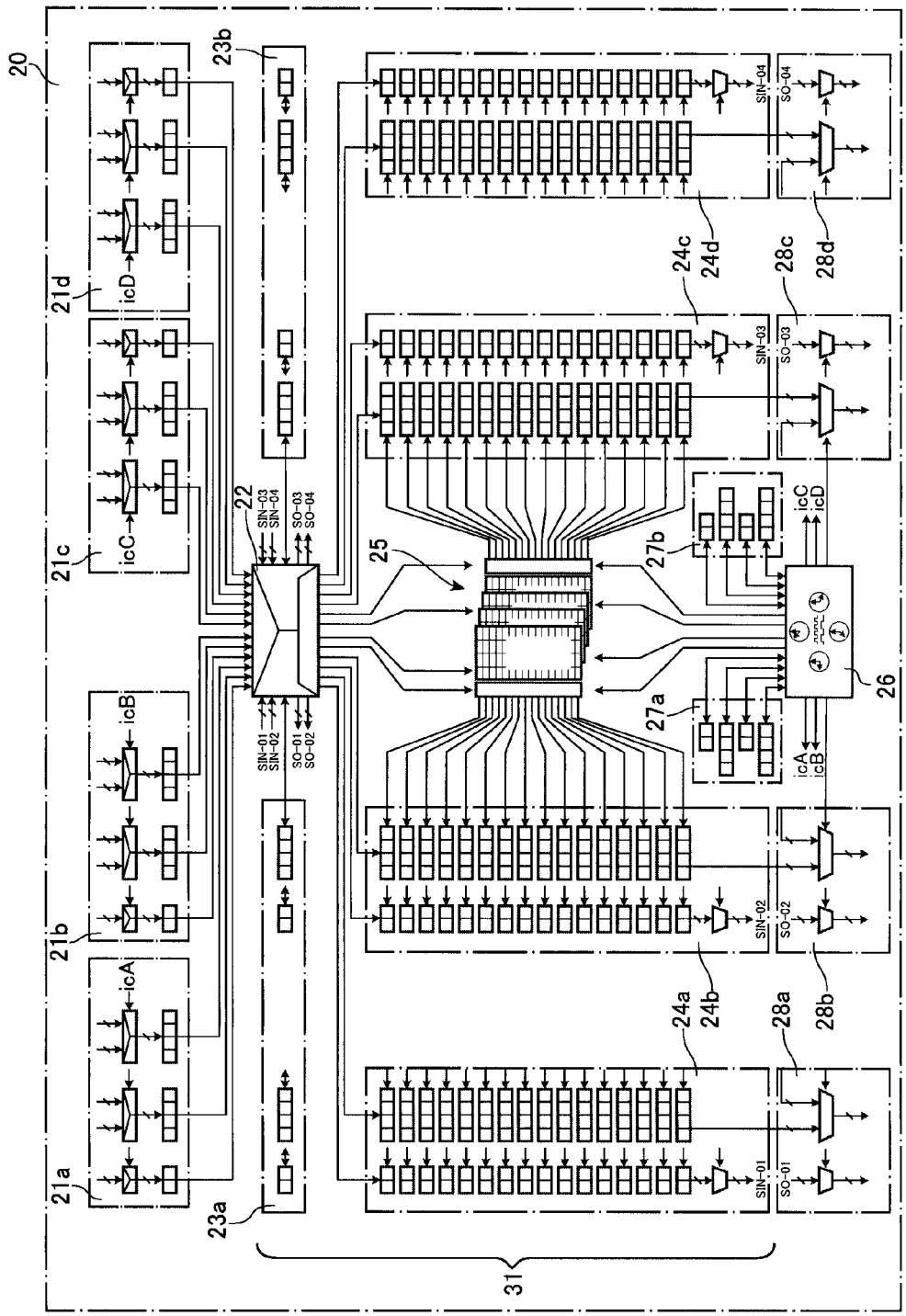
FIG. 4 is a diagram showing an overview of an element.

FIG. 4 shows an enlargement of the overall configuration of an element 20. The element 20 is a basic cell of the data processing unit (AxionNipeR) 10 and includes acquisition units (input units) 21a to 21d for four independent channels, post units (posting unit, output units, 2CH×2 are shared) 28a to 28d for four independent channels, and the logic element 25 that is the core. The logic element 25 has information internally as compressed, for making fundamental circuits that function as four-bit addition, subtraction, comparison and logic operations that are expected to have a high utilization frequency and compatibility up to eight-, twelve-, and sixteen bit extended operations, and the other elements 20 also has the same circuit configuration, and so does not require inputting of information from outside. In this system, new circuit configuration information that the logic element 25 is not held therein is introduced from the outside via the function information 5a and updated.

The acquisition units (acquisition modules, MUX-INA, -INB, -INC, -IND) 21a to 21d are four independent multiplexers that acquire data from the wiring channels 50. An input data signal is supplied from an adjacent wiring channel 50. The acquisition units 21a to 21d switch the connections with the wiring channels 50 on and off on a cycle-by-cycle basis. The decision whether to turn the connection to the wiring channels 50 on and off and latch data that has been posted to the wiring channels 50 in the input control unit 22 via the acquisition units 21a to 21d is entirely determined on a cycle-by-cycle basis by a timing controller (timing control unit, CTL-TMNG) 26 described below.

The input control unit (input control module, latch unit, MUX-4x4) 22 latches input signals on four independent channels in accordance with control pattern information supplied from the timing controller 26 and decides whether to replace and/or exchange input signals that have been stored in the registers 23a and 23b and whether to connect the input data to any of the function latch blocks 24a to 24d. The input control unit 22 realizes a switching function for data signals. The input control unit 22 has functions of self-diagnosis using special control code information and of decoding loading instructions for the function information 5a from outside, for example, the supply unit 2a of the CPU 2, via the wiring channels 50. Such functions are realized by operating in cooperation with the timing controller 26.

The function latch blocks (function latch modules, FNC-LA, -LB, -LC, -LD) 24a to 24d are latch modules that store internally decoded functions (internal decode) from the function memory (logic element) 25. The function latch blocks 24a to 24d respectively latch and store four cycles of functions in the horizontal direction in the drawing and carry out processing (including arithmetic operations and logic operations) on the input data with independent logic on four channels and then output the data.

The function latch blocks 24a to 24d includes a function which, when special control code, such as the function information 5a, has reached an element 20 and been latched, carries out importing of outside information included in such control code while ignoring an internal decode. As a rule, the latching of the internal decode is completed in one cycle. If the getting of outside information is carried out, one to four clock cycles may be consumed.

The function memory (LST-FXP) 25 is a memory in which internal logic that forms the core of the logic element (which is the core of the element 20) is stored. By using the function memory 25, four-bit-unit processing, eight-, twelve-, and sixteen-bit extended data processing, add/subtract/compare, logic operation, and other patterns with high usage frequency on elements 20 are compressed and stored inside the element 20. On receiving specified (special) loading code from outside via the acquisition units 21a to 21d or from the internal timing controller 26, the function memory 25 selects the required function information 5a from information stored in advance in accordance with the control information of the received (loaded) specified loading code and stores the selected function information 5a in the internal latches 24a to 24d.

The timing controller (timing control unit, CTL-TMNG) 26 receives timing control information from outside and controls four independent function blocks on a cycle-by-cycle basis (in clock-cycle units) based on the 4-bit function information 5a that has been internally provided or internally decoded and set in the registers 27a and 27b. That is, the timing controller 26 is a module that carries out timing control over the acquisition modules 21a to 21d, the function latch blocks 24a to 24d, and the post units 28a to 28d described below as respectively necessary.

One main function of the timing controller 26 is control of the timing at which input data is acquired or imported from the wiring channels 50. Another main function of the timing controller 26 is control of the timing at which output data is transmitted (posted, distributed) to a specified channel out of the wiring channels 50. If there is no need for output, the output signal is set at all zeros ("0") or all ones ("1"). This depends on whether negative logic is being processed or positive logic is being processed between the elements 20 that can connect to the wiring channels 50.

The timing controller 26 may have a self-diagnosis function and/or a function that automatically fetches or imports control information and/or a new function from the outside when a special pattern has been inputted or after the power supply is turned on (power on reset). Also, instead of merely controlling the various functions of the elements 20, the timing controller 26 may carry out control of the wiring boxes 58 belonging to the element 20 on a cycle-by-cycle basis. The timing controller 26 fundamentally carries out an internal decode and autonomously (independently) controls the element 20 iteratively or according to a predetermined pattern based on the function information 5a stored in the registers 27a and 27b. On the other hand, when the function information 5a is supplied via the wiring channels 50 from the outside together with special code, it is possible to directly output such function information 5a to the function latch blocks 24a to 24d, to temporarily change the functions (processing details) of the element 20 or to update the content of the function memory 25 and change the fundamental functions of the element 20.

The post units (MUX-OUTA, -OUTB, -OUTC, OUTD) 28a to 28d are four independent output channels that decide or specify the output to the wiring channels 50 from the element 20. Whether to set an output signal as active is always determined by the timing controller 26. The post units 28a to 28d switch connections to the wiring channels 50 on and off on a cycle-by-cycle basis. The post units 28a to 28d may post (place) output data onto respectively different wiring channels 50 or may post data with a predetermined bit length onto bus-type wiring channels 50. It is desirable for the post units 28a to 28d to include a multi-channel compatible output switch that realizes a synchronization function.

When data is not outputted (posted) to the wiring channels 50, the post units (posting units) 28a to 28d switch off (turn off) the connections between the wiring channels 50 and the output side of the element. By doing so, the wiring channels 50 are not driven by the post units 28a to 28d and are released from the element 20 that does not output and the wiring channels 50 are driven by other elements 20 for which timing for outputting data has been reached.

The post units 28a to 28d output additional information in addition to the output data. The additional information is used to distribute, via the wiring channels 50, an overflow, a zero flag, parity, a carry bit, a multi-bit operation-compatible carry, shift information, exception event output, or the like. The acquisition units 21a to 21d may obtain data that includes the additional information from the wiring channels 50 or may obtain data without the additional information.

The core 31 of an element 20 may include a fixed function block in addition to the plurality of blocks whose functions can be rewritten (variable function blocks) described above. The variable function blocks of the core 31 of an element 20 are equipped with the function memory 25 and it is possible to update the respective functions using only internal data (information) as necessary without loading from the outside. Functions (operations and the like) with an even higher usage frequency may also be covered or operable by the fixed function block, which may make it possible to reduce the amount of function information compressed in the function memory 25.

Note that although an example where the element 20 described above are configured four bits base has been shown, the elements may be based on two bits or on eight or more bits. In addition, the element 20 described above shows an example where four cycles of function information are stored in advance in a flip-flop or the registers 27a, 27b, and 24a to 24d so that autonomous control can be carried out internally. It is also possible to carry out processing by repeatedly internally expanding five or more cycles of function configuration information. Once four cycles of function information have ended, the fifth cycle onwards may be got from the outside or another memory, function information may be newly decoded from the function memory 25, or function information that has already been decoded may be repeatedly used.

If the repeat pattern of the processing to be executed in the element 20 is long, the fifth cycle, the ninth cycle, and the thirteenth cycle may be respectively loaded from the outside memory 5 and repeated. It is possible to provide a margin for the access time of the memory 5 and at the same time to achieve compatibility with long patterns.

Figure 5:
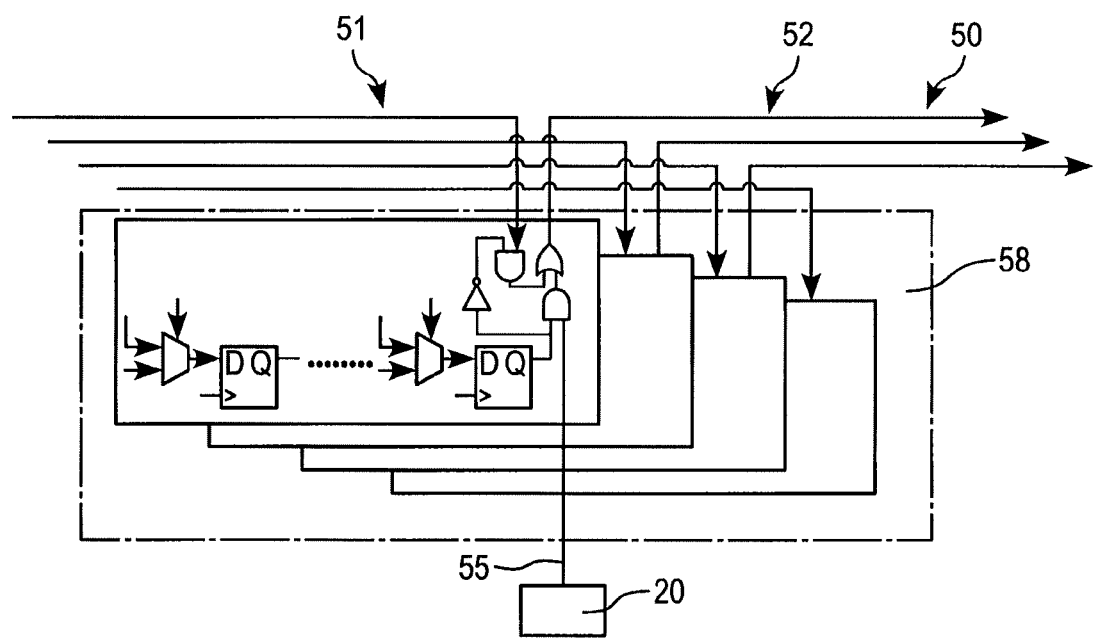
FIG. 5 is a diagram showing an example of a wiring box.

FIG. 5 shows one example of the internal configuration of a wiring box 58. The wiring box 58 is also equipped with a function that, on a cycle-by-cycle basis, changes the connections of the global wiring channels 51 and 52 and changes the connections from the global wiring channels 51 and 52 to the elements 20 via the local wiring channels 55. In the example shown in FIG. 5, a shift register-type flip-flop and a simple AND gate with a mask function are used to decide whether to get or to not get valid data.

Figure 6:
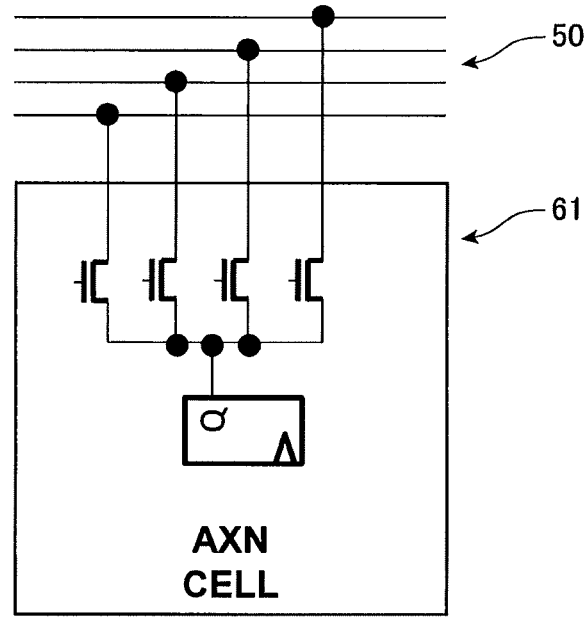
FIG. 6 is a diagram showing an example of an input-side module.

FIG. 6 shows one example of a module 61 that switches connections with a bus, which has been designated out of the wiring channels 50, on and off at the acquisition units 21a to 21d and the wiring boxes 58. The module 61 is an example that uses a simple structure where a MUX is unnecessary.

Figure 7:
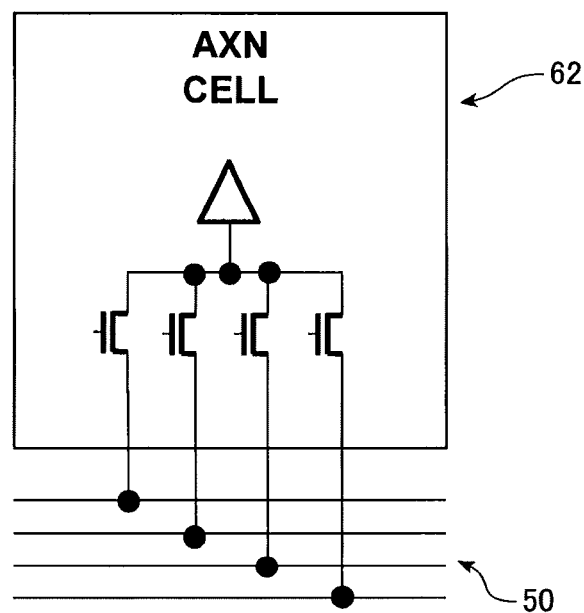
FIG. 7 is a diagram showing an example of an output-side module.

FIG. 7 shows an example of a module 62 that switches connections with a designated bus out of the wiring channels 50 on and off at the post units 28a to 28d and the wiring boxes 58. The wiring channels 50 are a structure that operates using an implicit assignment of time slots and the output side module 62 uses a configuration where only a programmed bus out of the wiring channels 50 is driven and unnecessary buses are released.

Figure 8:
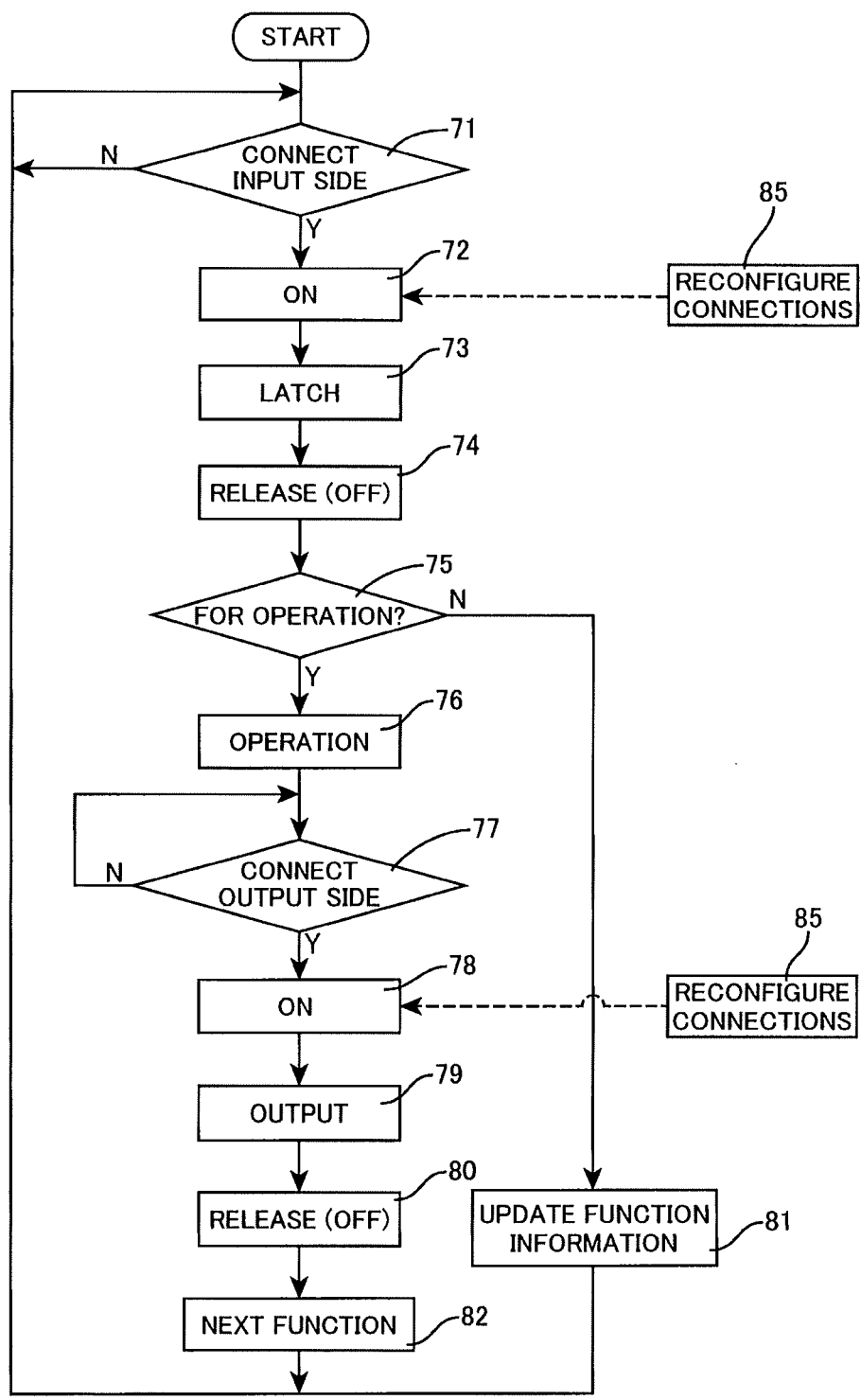
FIG. 8 is a flowchart showing a control method for an element.

FIG. 8 shows control over the timing of the respective elements 20 in the data processing unit 10 by way of a flowchart. Such control method may be implemented in the elements 20, the timing controller 26, or the like as logic (logic circuits) or may be provided as firmware or microprograms (program products) and stored in an appropriate recording medium such as a memory.

In step 71, when the timing controller 26 has determined that it is the timing (cycle) for connecting the input side of an element 20 to the wiring channels 50, in step 72 one of the acquisition units 21a to 21d is switched on and in step 73 the data that has been posted to the wiring channels 50 is latched. When the acquisition units 21a to 21d are switched on, in step 85 the connections of the vertical and horizontal wiring channels 51 and 52 in the wiring channels 50 are or have been reconfigured and the elements 20 that are localized with such reconfigured wiring channels 50 latch the posted data. After this, in step 74, the acquisition units 21a to 21d are switched off and the wiring channels 50 are released.

In step 75, it is determined whether the latched data is to be used in an operation or to be used to update the function information. If the data is function information, in step 81 the function memory 25 is updated or the data is latched in the function latch blocks 24a to 24d and the processing details of the elements 20 is updated.

If the data latched in step 75 is to be used in an operation, in step 76 processing (an operation) designated at such timing (in such cycle) is carried out inside the elements 20. In step 77, if the timing controller 26 determines that it is the timing (cycle) for connecting the output side to the wiring channels 50, in step 78 one of the post units 28a to 28d is switched on and in step 79 output data is posted to the wiring channels 50. When the post units 28a to 28d are to be switched on, in step 85 the connections with the vertical and horizontal wiring channels 51 and 52 of the wiring channels 50 are or have been reconfigured and the elements that are localized using the reconfigured wiring channels 50 become able to acquire data that has been posted on the wiring channels. After this, in step 80, the post units 28a to 28d are switched off and the wiring channels 50 are released.

Then, in step 82, the timing controller 26 recognizes the next function information and repeatedly controls the elements 20 in accordance with such function information.

Figure 9A:
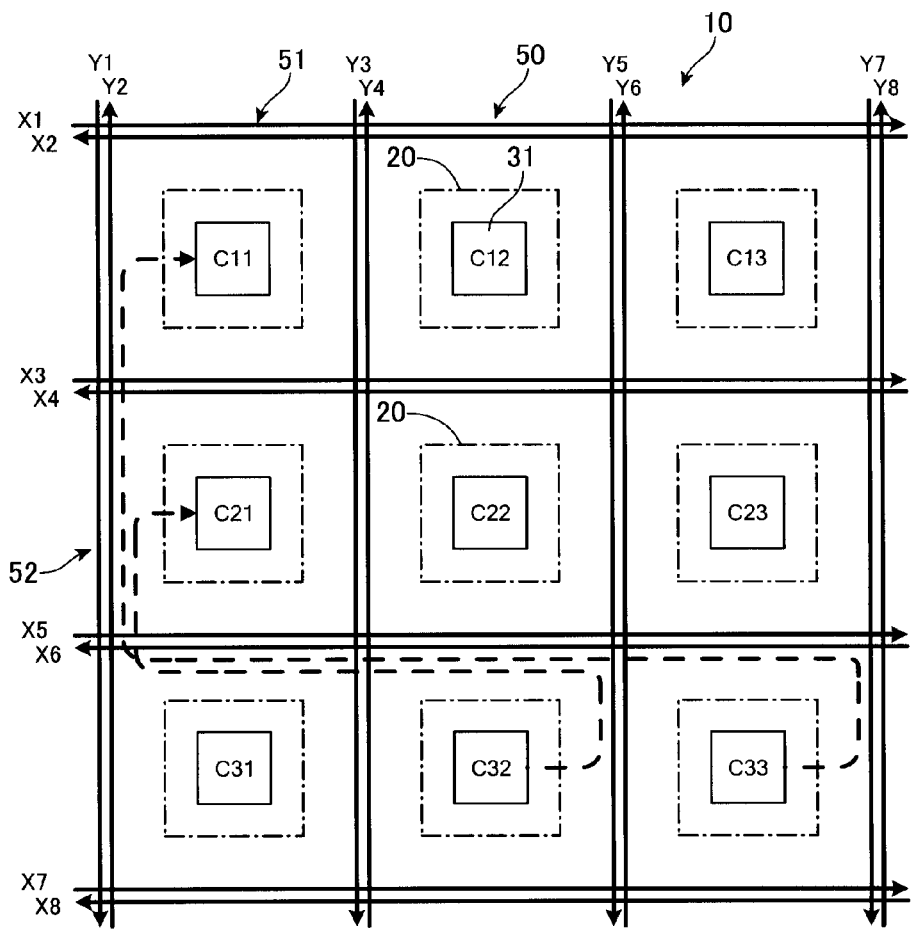
FIG. 9A is a diagram showing the usage state of wiring channels and FIG. 9B is a timing chart showing the usage state of wiring channels.
Figure 9B:
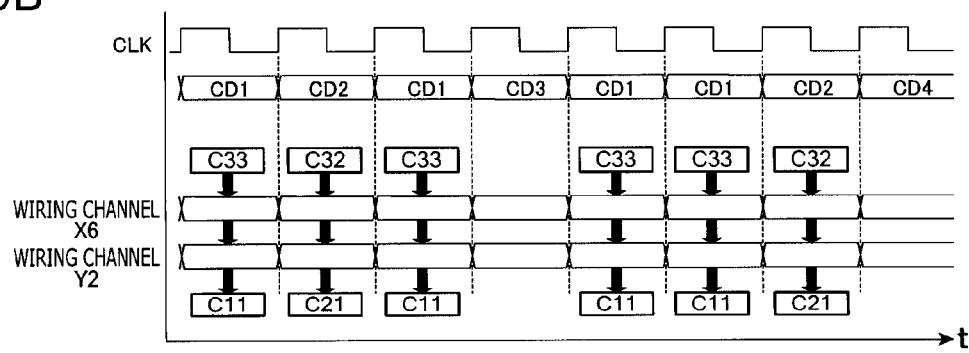

FIG. 9 schematically shows how the occupied state of the wiring channels 50 changes. FIG. 9(a) shows how a process (logic operation) where data is exchanged between an element C33 and an element C11 and a process where data is exchanged between an element C32 and an element C21 are implemented in a time division by using the physically the same wiring channels 50, more specifically switching on and off for the wiring channels X6 and Y2. FIG. 9(b) is a timing chart showing how the wiring channels X6 and Y2 are occupied.

In the function information CD1, the elements C33 and C11 are switched on for the wiring channels X6 and Y2 and the exchanging of data is carried out between such elements. In the function information CD2, the elements C32 and C21 are switched on for the wiring channels X6 and Y2 and the exchanging of data is carried out between such elements. In the function information CD3 and CD4, the elements C11, C21, C32, and C33 are switched off for the wiring channels X6 and Y2 and such wiring is accessed by other elements 20 that carry out posting and acquisition. The user of the wiring channels X6 and Y2 changes on a cycle-by-cycle basis so that the wiring channels are occupied in a time division. It is of course also possible for the user of a wiring channel to be fixed.

The transmitters and receivers on the wiring channels 50 of the data processing unit 10 change on a cycle-by-cycle basis and a circuit for carrying out the intended operation via the wiring channels 50 is not formed. The wiring channels 50 are used as a broadcast medium in cycles (in cycle units) between the elements (cells) 20 connected to the wiring channels 50 without needing a communication protocol to be established, with users being able to access the wiring channels on a cycle-by-cycle basis.

The wiring channels 50 function not as asynchronous parts (items, stuffs) on which signals are transmitted but as a medium (items, parts) that transmits information in a range synchronizing with the transmitter and/or the receiver. This means that the elements 20 are capable of outputting (posting) information related to different logic or algorithms on a cycle to the wiring resources in a time division and other cells 20 are capable of acquiring information (data, signals) in a time (cycle) division. Accordingly, it is possible to provide a data processing device where it is possible to reduce the wiring resources and that has a high packing density and a high utilization efficiency of hardware. In addition, it is possible to use wiring resources as items (elements) that carry out logic operations in cycle units.

The core 31 that is a logic operation element may be an element (coarse grain) that carries out logic operations, such as additions and multiplications, with a comparatively large number of gates, or may be an element (fine grain) that carries out logic operations, such as an AND, NAND, OR, NOR, or EXOR with four or fewer inputs, with a comparatively low number of gates. In the present embodiment, a fine grain core 31 is used. The logic operation may use a look up table, or may be a selector type, or may be a memory type.

Figure 10:
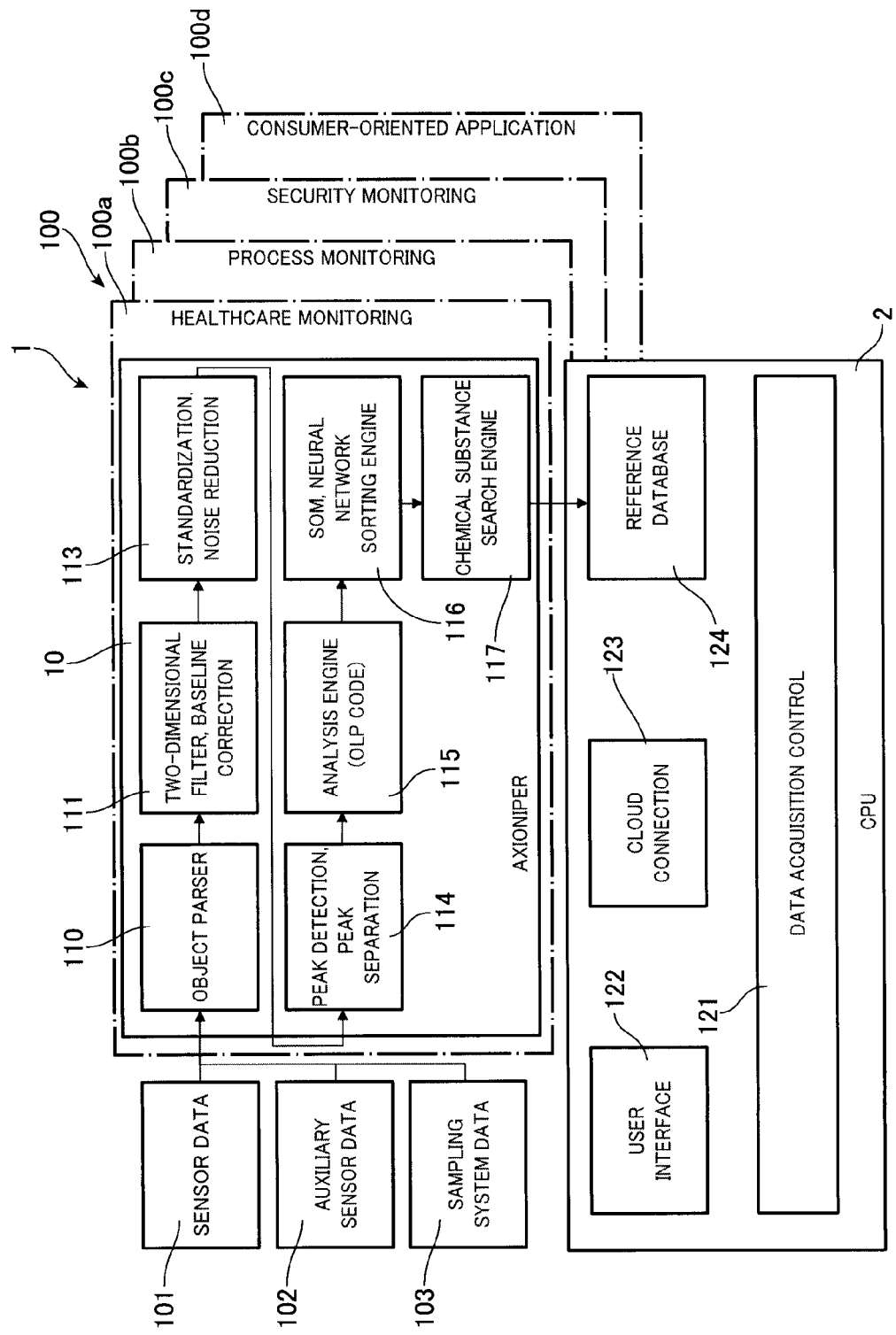
FIG. 10 is a diagram showing an example of a system including the data processing device.

FIG. 10 shows an example of a system (OLP) 100 including the data processing device 1. The system 100 analyzes data 101 obtained from a sensor such as a FAIMS, and is capable of implementing a variety of functions in a non-circuit type data processing unit 10 in parallel or in a time division. The system 100 can be used as a platform for a variety of applications. A number of example applications are healthcare monitoring 100a, process monitoring 100b, security monitoring 100c, and a consumer-oriented odor business application 100d. In addition to the data 101 obtained from a sensor such as a FAIMS (ion mobility sensor) or an MS (mass sensor), auxiliary sensor data 102 such as temperature, humidity, pressure, peripheral images, and GPS and data 103 from a sampling system, for example, sampling time, and data relating to the sampled material, are inputted into the device 1.

As examples, a parser 110 that determines the category or the like of a material to be measured and sets analysis conditions, a unit 111 that carries out data correction such as baseline correction, a unit 113 that standardizes peaks to reduce noise, a unit 114 that detects and separates peaks included in the sensor data 101, an analysis engine 115 that determines species (types, properties, attributes) and amounts from the separated peaks, an engine 116 that sorts or categorizes chemical substances to be measured from information obtained by the analysis engine 115 using a method such as SOM (Self-Organizing Maps) or a neural network, and a unit (function) 117 that searches a database inside the device or via a network to determine a chemical substance being measured are implemented in the data processing unit 10. In principle, such functions are implemented in the data processing unit 10 by information that selects the elements 20 and information showing timing of accesses to the wiring channels.

The CPU 2 realizes a function that supports processing by the data processing unit 10. As examples, the CPU 2 provides a function 124 that accesses a reference database, a function 123 that accesses the cloud (a LAN), a user interface function 122, and a data acquisition control function 121. Such functions can be implemented in the data processing unit 10 using free space and/or free time in the data processing unit 10.

There is demand for a large-scale parallel data processing engine for detecting and analyzing chemical substances in real time. By detecting and analyzing chemical substances in real time, it is possible to provide revolutionary services to users such as identification and quantification of biomarkers used for detecting disease, monitoring of health and/or vital functions, and provision of managed care using remote monitoring technologies. The platform for providing such services, applications, behaviors needs to be intelligent, extensible, and to satisfy demands relating to a variety of applications and performance. Since the device 1 that includes the data processing unit 10 includes, in addition to functioning as parallel processing hardware where a plurality of elements are capable of freely accessing for wiring channels, a non-circuit type information processing sector that is dynamically programmable according to timing control, the device 1 provides a hardware that satisfies the needs described above.

One sensor is a FAIMS (Field Asymmetric ion mobility spectrometer). A FAIMS is suited to detection of minute amounts of chemical substances included in air or the like, and attempts are being made to apply FAIMS to a wide range of applications such as security, environmental monitoring, health care, manufacturing processes, and energy. Small and lightweight FAIMS and MS (mass sensors) of a chip level have started to be provided on the market, and by using the device 1 that can be realized at chip level as a platform for analysis, it is possible to provide a real-time chemical substance analysis device at chip level that is small, lightweight, mechanically and thermally resilient, and low power consumption.

The invention claimed is:

1. A device comprising:
a plurality of channels that are laid out in two dimensions or in three dimensions and are reconfigurable on a cycle-by-cycle basis; and
a plurality of logic elements that are accessible to a part of the plurality of channels, wherein each of the plurality of logic elements is configured to: (a) access on a first reconfigured part of the plurality of channels to broadcast a signal via the first reconfigured part of the plurality of channels at a first cycle, and (b) access on a second reconfigured part of the plurality of channels to receive the broadcasted signal via the second reconfigured part of the plurality of channels at a second cycle.

2. The device according to claim 1
wherein the plurality of channels are configured to reconfigure autonomously, and
wherein each of the plurality of logic elements is configured to broadcast and receive autonomously.

3. The device according to claim 1
wherein each of the plurality of logic elements is further configured to change a processing detail of the respective logic element on a cycle-by-cycle basis.

4. A processing method of a device that includes a plurality of channels laid out in two dimensions or in three dimensions, and a plurality of logic elements accessible to a part of the plurality of channels, the method including:
reconfiguring a first part of the plurality of channels on a cycle-by-cycle basis;
accessing one of the plurality of logic elements on the first reconfigured part of the plurality of channels to broadcast a signal via the first reconfigured part of the plurality of channels at a first cycle; and accessing other one of the plurality of logic elements on the first reconfigured part of the plurality of channels to receive the broadcasted signal via the first reconfigured part of the plurality of channels at the first cycle.

5. The method according to claim 4, further including changing a processing detail of at least one of the plurality of logic elements on a cycle-by-cycle basis.

* * * * *